United States Patent
Kondo et al.

(10) Patent No.: US 9,742,552 B2
(45) Date of Patent: Aug. 22, 2017

(54) PHASE LOCKED LOOP, WIRELESS COMMUNICATION APPARATUS AND WIRELESS COMMUNICATION METHOD

(71) Applicant: Kabushiki Kaisha Toshiba, Minato-ku (JP)

(72) Inventors: Satoshi Kondo, Kawasaki (JP); Akihide Sai, Kawasaki (JP); Masanori Furuta, Odawara (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/189,236

(22) Filed: Jun. 22, 2016

(65) Prior Publication Data

US 2016/0380759 A1    Dec. 29, 2016

(30) Foreign Application Priority Data

Jun. 26, 2015    (JP) .................................. 2015-128983

(51) Int. Cl.
*H04L 7/033*    (2006.01)
*H03L 7/081*    (2006.01)

(52) U.S. Cl.
CPC ............ *H04L 7/0332* (2013.01); *H03L 7/081* (2013.01); *H04L 7/0334* (2013.01)

(58) Field of Classification Search
CPC ....... H03L 2207/50; H03L 7/06; H03L 7/095; H03C 3/0933
See application file for complete search history.

(56) References Cited

U.S. PATENT DOCUMENTS 6,738,922 B1 *  5/2004  Warwar ................. H03L 7/081
                                                              713/500
8,742,808 B2    6/2014  Staszewski et al.
(Continued)

FOREIGN PATENT DOCUMENTS

JP        2011-229028        11/2011

OTHER PUBLICATIONS

"A 4-GHz All Digital PLL With Low-Power TDC and Phase-Error Compensation", Lee et al. IEEE Transactions on Circuits and Systems—I: Regular Papers, vol. 59, No. 8, Aug. 2012, pp. 1706-1719.*

(Continued)

*Primary Examiner* — Vineeta Panwalkar
(74) *Attorney, Agent, or Firm* — Oblon, McClelland, Maier & Neustadt, L.L.P.

(57) ABSTRACT

A phase locked loop has an integer phase detector to detect an integer phase by measuring a cycle number, a fractional phase detector to detect a fractional phase of smaller than one cycle between a reference signal and the oscillation signal, a frequency error generator to generate a frequency error signal between the reference signal and the oscillation signal, a glitch corrector to correct the frequency error signal to generate and output a glitch-corrected signal and the frequency error signal, a phase error generator to generate a phase error by integrating an output signal of the glitch corrector, an oscillator controller to control an oscillation frequency of the oscillation signal, and a synchronous detector to detect whether a phase of the reference signal and a phase of the oscillation signal are in an phase-lock state, and to stop detection of the integer phase when the phase-lock state is detected.

13 Claims, 9 Drawing Sheets

(56) References Cited

U.S. PATENT DOCUMENTS

2009/0141845 A1* 6/2009 Ballantyne .............. H03L 7/085
　　　　　　　　　　　　　　　　　　　　　　　375/376
2012/0013363 A1* 1/2012 Takinami .................. H03L 7/16
　　　　　　　　　　　　　　　　　　　　　　　327/34

OTHER PUBLICATIONS

Varrshi Krishna Chillara et. al., "A880uW 2.1-2.7GHz All-Digital PLL-based Frequency Modulator with a DTC-assisted Snapshot TDC for WPAN (Bluetooth Smart and Zigbee) Applications;" IEEE hternetional Solid-State Circuits Conference, Sessions 9, Feb. 2014, Digest Tech Papers, pp. 172-174.

Robert Bogdan Staszewski et al., "ALL-Digital PLL and Transmitter for Mobile Phones", IEEE Journal of Solid-State Circuits; vol. 40, No. 12, Dec. 2005, pp. 2469-2482.

* cited by examiner

PHASE LOCKED LOOP, WIRELESS COMMUNICATION APPARATUS AND WIRELESS COMMUNICATION METHOD

CROSS-REFERENCE TO RELATED APPLICATIONS

This application is based upon and claims the benefit of priority from the prior Japanese Patent Application No. 2015-128983, filed on Jun. 26, 2015, the entire contents of which are incorporated herein by reference.

FIELD

Embodiments of the present invention relate to a phase locked loop, a wireless communication apparatus, and a wireless communication method.

BACKGROUND

A digital phase locked loop detects an oscillator phase and controls an oscillator frequency based on the detected phase information. The phase detection is performed in a manner that a phase component corresponding to an integer part (integer phase) is measured by a counter and a phase component corresponding to a fractional part (fractional phase) is detected by a time-to-digital converter (TDC).

The counter and the TDC operate at an oscillator frequency rate, thus consuming much power. A technique proposed to solve the problem uses a characteristic of an oscillator such that, as the oscillator comes closer to a phase-lock state, the change in oscillator phase difference becomes smaller. In the technique, the counter stops its operation at the moment close to the phase-lock state to reduce the power consumption of the phase locked loop.

However, when the counter stops its operation in the phase locked loop, a glitch is generated in a frequency or phase error signal. The glitch is different from true phase information and is generated to have a larger value than the TDC input range. Therefore, the glitch causes that the oscillator, which performs frequency control based on the TDC output signal, reduces its frequency stability so that the phase-lock state cannot be maintained.

DETAILED DESCRIPTION

According to the present embodiment, there is provided a phase locked loop including:

an integer phase detector to detect an integer phase by measuring a cycle number of at least one of an output signal of an oscillator and an oscillation signal that is a division signal of the output signal;

a fractional phase detector to detect a fractional phase of smaller than one cycle between a reference signal and the oscillation signal;

a frequency error generator to generate a frequency error signal between the reference signal and the oscillation signal based on a frequency control signal which controls a frequency of the reference signal, and the integer and fractional phases;

a glitch corrector to correct the frequency error signal to generate and output a glitch-corrected signal when an absolute value of the frequency error signal is equal to or larger than a specific threshold value and to output the frequency error signal when the absolute value of the frequency error signal is smaller than the threshold value;

a phase error generator to generate a phase error by integrating an output signal of the glitch corrector by temporal integration;

an oscillator controller to control an oscillation frequency of the oscillation signal based on the phase error signal; and a synchronous detector to detect whether a phase of the reference signal and a phase of the oscillation signal are in a phase-lock state based on the output signal of the glitch corrector, and to stop detection of the integer phase when the phase-lock state is detected.

Embodiments of the present invention will be explained below with reference to the drawings.

(First Embodiment)

Figure 1:
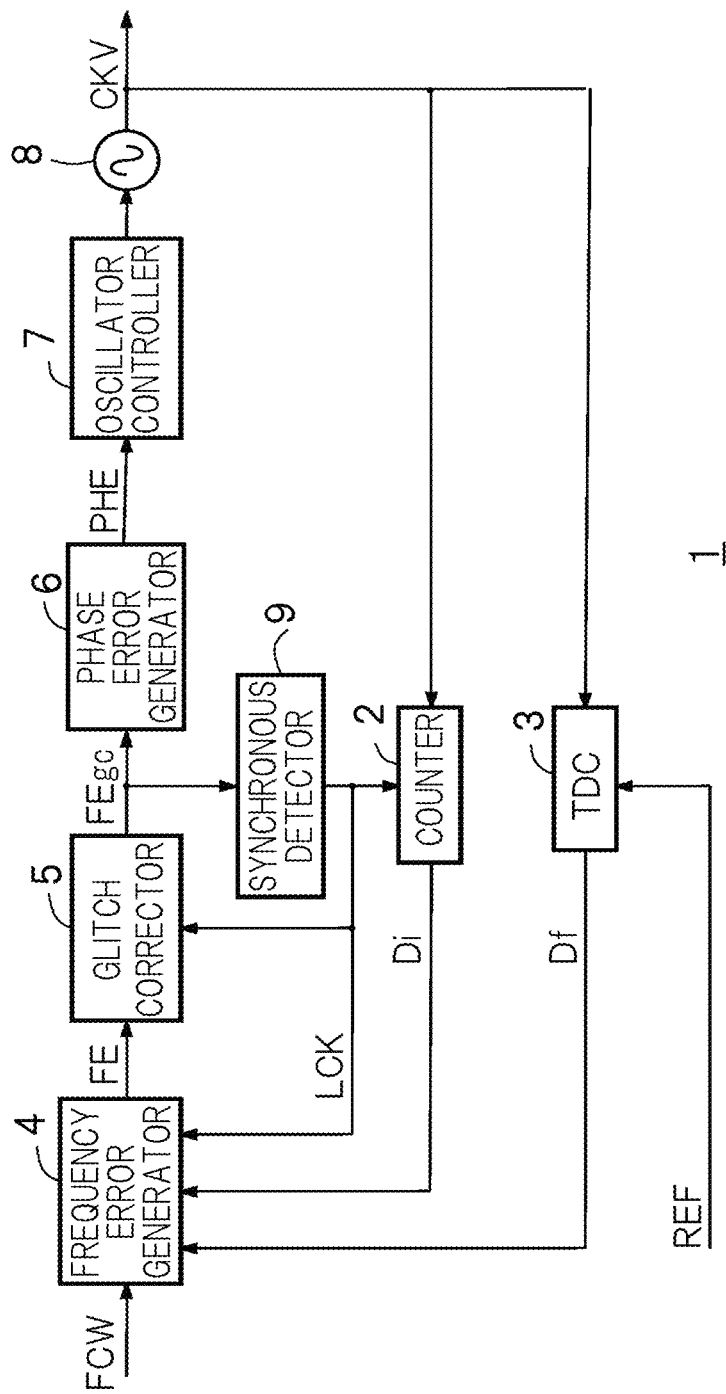
FIG. 1 is a block diagram schematically showing the structure of a phase locked loop 1 according to a first embodiment.

FIG. 1 is a block diagram schematically showing a configuration of a phase locked loop 1 according to a first embodiment. The phase locked loop 1 of FIG. 1 is an all digital phase-locked loop (ADPLL) provided with a counter (integer phase detector) 2, a TDC (fractional phase detector) 3, a frequency error generator 4, a glitch corrector 5, a phase error generator 6, and an oscillator controller 7.

The oscillator 8 is a voltage-controlled oscillator (VCO), a digitally-controlled oscillator (DCO), etc. having an LC oscillator, a ring oscillator, etc. The VCO controls an oscillation frequency with an analog control voltage. The DCO controls an oscillation frequency with a digital control code.

Figure 2:
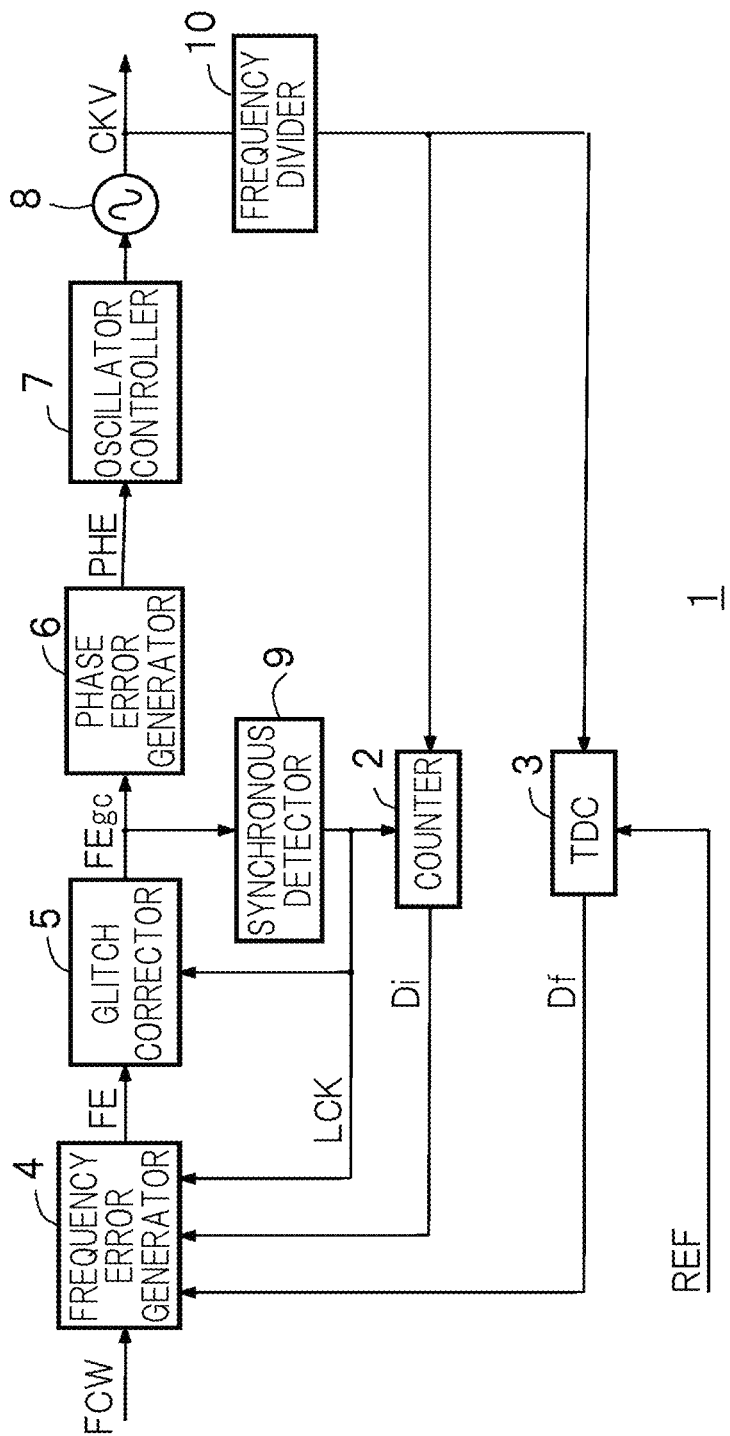
FIG. 2 is a block diagram of a phase locked loop 1 having a frequency divider.

In FIG. 1, the output signal of the oscillator 8 is input to the counter 2 and the TDC 3. However, as shown in FIG. 2, a division signal obtained by dividing the output signal of the oscillator 8 by a frequency divider 10 may be input to the counter 2 and the TDC 3. The signal input via the frequency divider 10 can delay the operational speed of the counter 2 and the TDC 3 to reduce power consumption. In the present embodiment, the signal input to the counter 2 and the TDC 3 directly from the oscillator 8 or via the frequency divider 10 is referred to as an oscillation signal.

The counter 2 counts the number of cycles of the oscillation signal to detect an integer phase of the oscillation signal. The TDC 3 measures a time difference (phase difference) between a reference signal and the oscillation signal to detect a fractional phase of the oscillation signal.

Based on a frequency control signal and the integer and fractional phases, the frequency error generator 4 generates a frequency error signal FE between a reference signal REF having a frequency specified by a frequency control signal FCW, and the oscillation signal. The frequency error signal FE may contain a glitch. The glitch is a noise different from true phase information and hence may cause that the frequency stability of the oscillator 8 based on the output signal of the TDC 3 decreases and a phase-lock state cannot be maintained. For this reason, the glitch corrector 5 is provided in the present embodiment.

When the absolute value of the frequency error signal FE is equal to or larger than a specific threshold value, the glitch corrector 5 corrects the frequency error signal FE to generate a glitch-corrected signal FEgc. When the absolute value of the frequency error signal FE is smaller than the threshold value, the glitch corrector 5 outputs the frequency error signal FE. The phase error generator 6 integrates the output signal of the glitch corrector 5 by temporal integration to generate a phase error signal. Based on the phase error signal, the oscillator controller 7 generates an oscillation control signal for controlling the oscillation frequency of the oscillator 8.

Based on the output signal of the glitch corrector 5, the synchronous detector 9 detects whether the reference signal REF and the oscillation signal are in a phase-lock state. When the signals are in the phase-lock state, the synchronous detector 9 puts a control signal CLK for stopping the measuring operation of the counter 2, in a specific logic. The control signal CLK is then input to the counter 2. The counter 2 stops the measuring operation when the control signal CLK has the specific logic. The phase-lock state does not mean a complete phase-lock state, but means a state in which the frequency error between the reference signal REF and the oscillation signal is decreased to a specific value or lower. Namely, the phase-lock state means that the integer phases of the reference signal REF and the oscillation signal match each other. As described, when the phase-lock state is detected, the synchronous detector 9 stops integer phase detection.

Figure 3A:
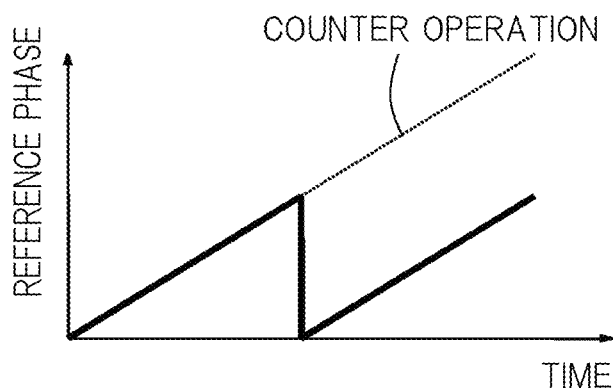
FIG. 3A is a graph showing a change in reference phase.
Figure 3B:
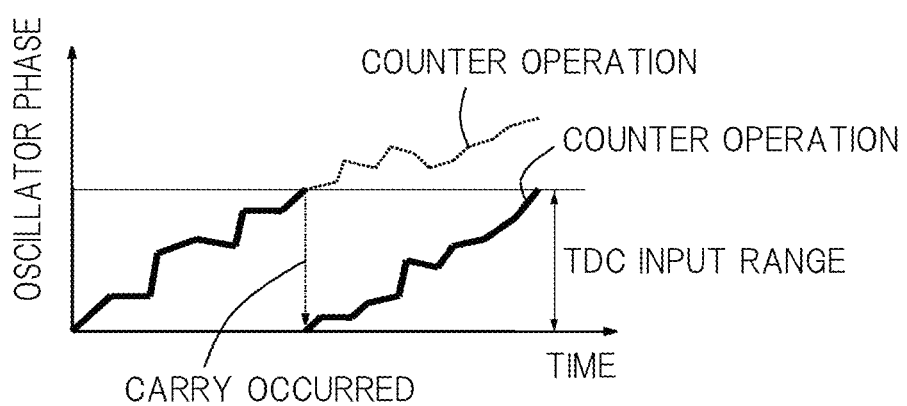
FIG. 3B is a graph showing a change in oscillator phase.
Figure 4A:
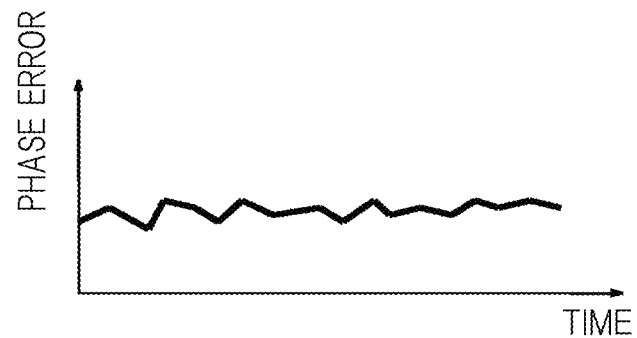
FIG. 4A is a graph showing a phase error with no glitches.
Figure 4B:
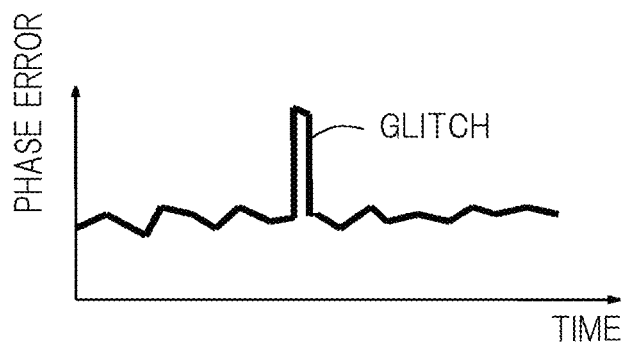
FIG. 4B is a graph showing a phase error with a glitch.

FIGS. 3A and 3B are graphs showing phase change of the reference signal REF and the oscillator 8 before and after that the counter 2 stops the measuring operation. FIGS. 4A and 4B are graphs showing two cases where a glitch is contained and not contained in a phase error.

While the counter 2 continues the measuring operation, as shown in FIGS. 3A and 3B, the reference signal REF and the oscillation signal have a phase advance. However, when the counter 2 stops the measuring operation, since there are fractional phases only, the phases of the reference signal REF and the oscillation signal become discontinuous when the phase is 1 (=2π). The discontinuous fractional phase means that there is carrying or borrowing in fractional phase. However, the reference signal REF and the oscillation signal have a timing error in carrying or borrowing due to noise or the like. The integer phase information originally possessed by the counter 2 is also lost. Due to the timing error, an instantaneous glitch such as shown in FIG. 4B is generated in the frequency error signal FE output from the frequency error generator 4.

The above-described glitch corrector 5 detects a glitch contained in the frequency error signal FE to perform a process of completely cancelling the effect of the glitch. With this process, even if a glitch is generated, the oscillator 8 (phase locked loop 1) can operate stably.

Figure 5:
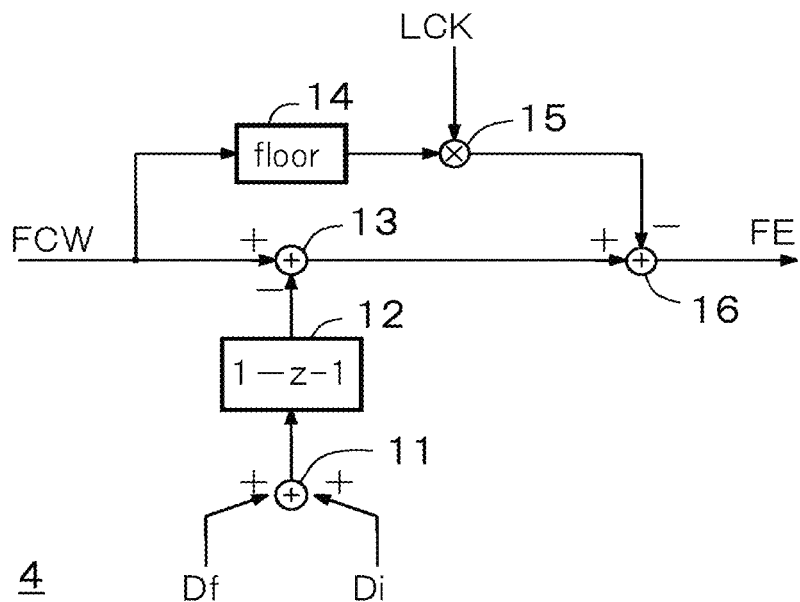
FIG. 5 is a block diagram showing an example of the internal structure of a frequency error generator.

FIG. 5 is a block diagram showing an example of the internal configuration of the frequency error generator 4. The frequency error generator 4 of FIG. 5 has an adder 11, a differentiator 12, a subtractor 13, a floor function arithmetic unit (floor function arithmetic circuitry) 14, a multiplier 15, and a subtractor 16. The adder 11 adds an integer phase Di obtained by the counter 2 and a fractional phase Df obtained by the TDC 3. The differentiator 12 differentiates the output signal of the adder 11 to generate a frequency component signal. The subtractor 13 generates a differential signal between a frequency control signal FCW for controlling the frequency of the reference signal REF, and the output signal of the differentiator 12.

The floor function arithmetic unit 14 applies a floor function to the frequency control signal FCW to extract an integer part of the frequency control signal FCW. The multiplier 15 multiplies the control signal CLK from the synchronous detector 9 and the output signal of the floor function arithmetic unit 14. Therefore, if the control signal CLK=0, namely, if the reference signal and the oscillation signal are not in the phase-lock state, the multiplier 15 outputs zero. On the contrary, if the control signal CLK=1, namely, if the reference signal and the oscillation signal are in the phase-lock state, the multiplier 15 outputs an integer part of the frequency control signal FCW that is the output of the floor function arithmetic unit 14.

The subtractor 16 subtracts the output signal of the multiplier 15 from the output signal of the subtractor 13 to output a frequency error signal FE.

The internal configuration of the frequency error generator 4 shown in FIG. 5 is merely an example. There is no restriction on the detail of the internal configuration as long as the frequency error signal FE is finally generated. Moreover, in the configuration of FIG. 5, at least part of the order of operations may be changed. For example, the subtraction operation of the subtractor 16 may be performed before the subtraction operation of the subtractor 13. Moreover, on behalf of the floor function arithmetic unit 14 and the multiplier 15, a process for substituting zero for the integer part of the frequency control signal FCW may be performed.

Figure 6:
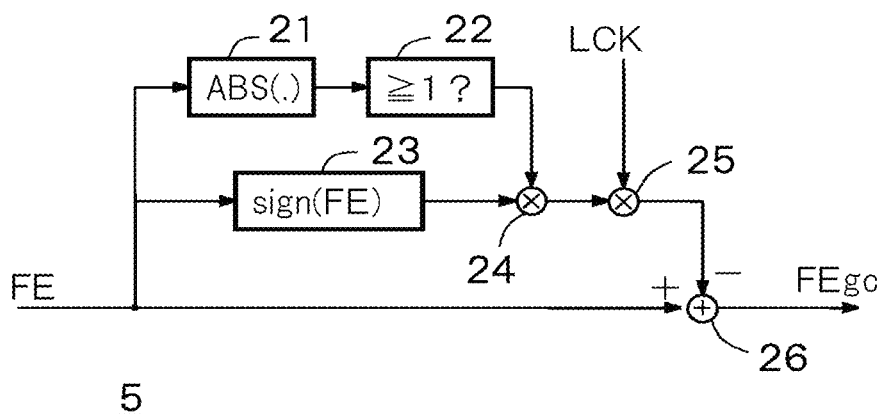
FIG. 6 is a block diagram showing an example of the internal structure of a glitch corrector.

FIG. 6 is a block diagram showing an example of the internal configuration of the glitch corrector 5. The glitch corrector 5 of FIG. 6 prevents the occurrence of a large false frequency error caused by carrying or borrowing that occurs on the oscillator phase and the reference phase at different timings due to noise of the oscillator 8, quantization noise of the TDC 3, etc. while the counter 2 is not operating. The glitch corrector 5 can be switched between an operating state and a non-operating state by the control signal CLK.

The glitch corrector 5 has an absolute-value arithmetic unit (absolute-value arithmetic circuitry) 21, an absolute-value determination unit (absolute-value determination circuitry) 22, a sign determination unit (sign determination circuitry) 23, an arithmetic unit (arithmetic circuitry) 24, a multiplier 25, and a subtractor 26.

The absolute-value arithmetic unit 21 obtains an absolute value of the frequency error signal FE. The absolute-value determination unit 22 determines whether the absolute value of the frequency error signal FE is equal to or larger than a specific threshold value. In the phase-lock state, since a large frequency error does not basically occur, if the frequency error signal FE contains a glitch, the absolute value of the frequency error signal FE is equal to or larger than the threshold value. Then, the sign determination unit 23 determines whether the frequency error signal FE is positive or negative. If the frequency error signal FE is positive, the arithmetic unit 24 subtracts a value (1 phase=2π) corresponding to 1 LSB of the counter 2 from the frequency error signal FE. If the frequency error signal FE is negative, the arithmetic unit 24 adds the value (1 phase=2π) corresponding to 1 LSB of the counter 2 to the frequency error signal FE. A glitch-corrected frequency error signal FEgc output from the subtractor 26 is expressed by the following expression (1).

$$FEgc=FE-\text{sign (FE)} \quad (1)$$

It is supposed that the absolute value of the frequency error signal FE is smaller than a value corresponding to the input range of the TDC 3. In this case, it is deemed that there is no glitch, and the output signal of the arithmetic unit 24 thus becomes zero so that the output signal FEgc of the subtractor 26 has the same value as the frequency error signal FE. While the synchronous detector 9 is determining that it is not in the phase-lock state, the control signal CLK turns to be low so that the multiplier 25 outputs zero. Therefore, in the case of an out-of-phase state, the glitch corrector 5 outputs the frequency error signal FE as it is.

As described above, based on a false frequency error cause by noise, the glitch corrector 5 performs an arithmetic operation of the above-described expression (1) to correct false information to be true frequency error information.

The threshold value can take any value. In order to reduce the amount of arithmetic operation, the absolute-value determination unit 22 may perform a process with a simpler arithmetic operation technique.

As described above, in the first embodiment, when the reference signal REF and the oscillation signal are in the phase-lock state, it is determined that there is no change in the integer phase, the counter 2 stops the measuring operation to reduce power consumption. Then, the absolute value of the frequency error signal FE is compared with the threshold value. If the absolute value of the frequency error signal FE is equal to or larger than the threshold value, it is determined that there is a glitch. A component corresponding to the effect of the glitch is removed from the frequency error signal FE to generate a glitch-corrected signal FEgc. Then, based on the glitch-corrected signal FEgc, the TDC 3 performs a process of matching the frequencies of the reference signal REF and the oscillation signal. Accordingly, with no effects of glitch, the reference signal REF and the oscillation signal can be stably maintained in the phase-lock state.

(Second Embodiment)

The second embodiment is to detect, not a frequency error, but a phase error.

Figure 7:
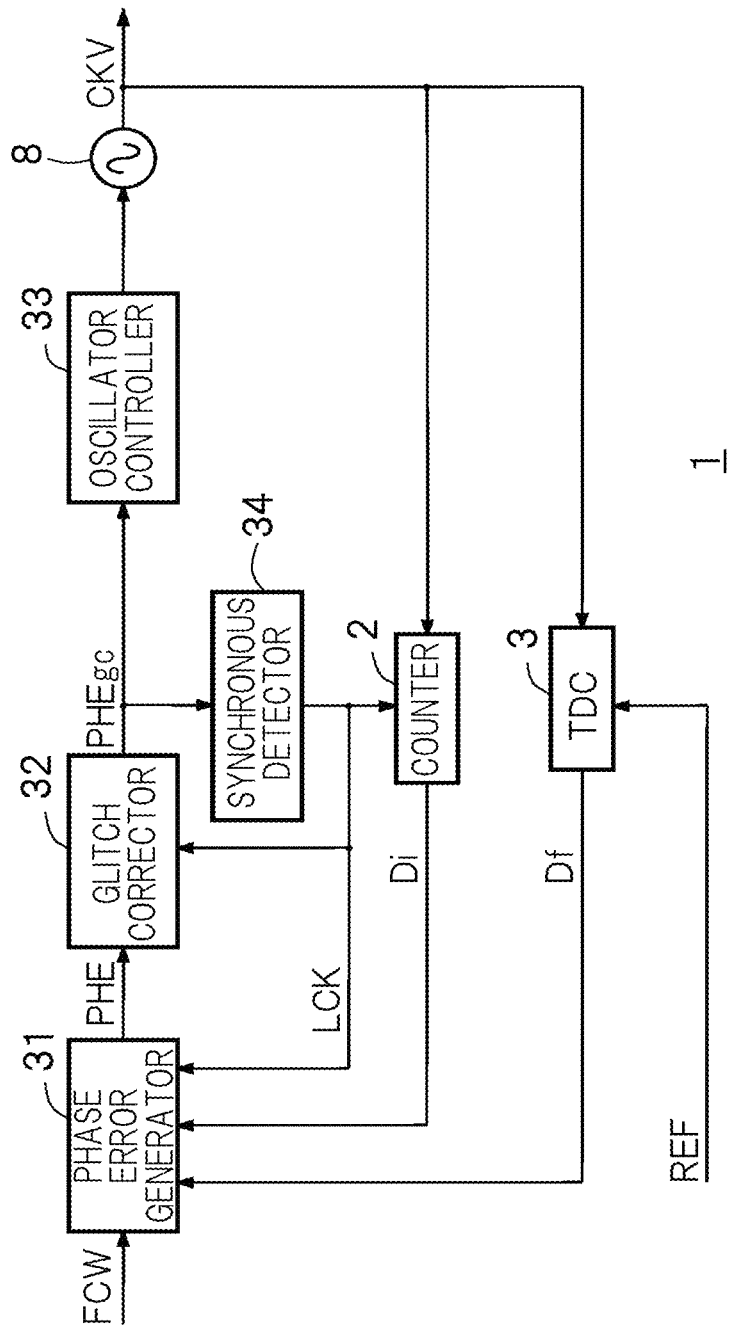
FIG. 7 is a block diagram schematically showing the structure of a phase locked loop according to a second embodiment.

FIG. 7 is a block diagram schematically showing a configuration of a phase locked loop 1 according to the second embodiment. The phase locked loop 1 of FIG. 7 is an ADPLL provided with a counter 2, a TDC 3, a phase error generator 31, a glitch corrector 32, an oscillator controller 33, an oscillator 8, a synchronous detector 34. The phase locked loop 1 of FIG. 7 is provided with the phase error generator 31 instead of the frequency error generator 4 of FIG. 1. Based on a frequency control signal FCW, an integer phase detected by the counter 2 and a fractional phase detected by the TDC 3, the phase error generator 31 generates a phase error signal between a reference signal REF having a frequency specified by the frequency control signal FCW, and an oscillation signal.

The glitch corrector 32 detects a glitch contained in a phase error signal PHE to generate a glitch-corrected signal PHEgc having an effect of the glitch removed.

Figure 8:
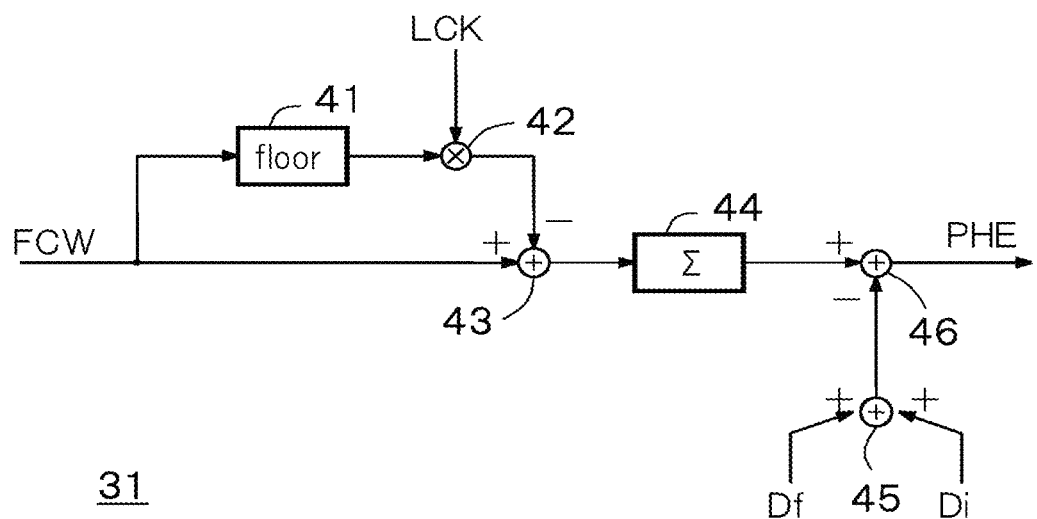
FIG. 8 is a block diagram showing an example of the internal structure of a phase error generator.

FIG. 8 is a block diagram showing an example of the internal configuration of the phase error generator 31. The phase error generator 31 of FIG. 8 has a floor function arithmetic unit (floor function arithmetic circuitry) 41, a multiplier 42, a subtractor 43, a reference phase accumulator 44, an adder 45, and a subtractor 46.

The floor function arithmetic unit 41 applies a floor function to the frequency control signal FCW to extract an integer part of the frequency control signal FCW. The multiplier multiplies a control signal CLK from the synchronous detector 34 and the output signal of the floor function arithmetic unit 41. The subtractor 43 subtracts the output signal of the multiplier 42 from the frequency control signal FCW.

The reference phase accumulator 44 integrates the output signal of the subtractor 43 by temporal integration to detect a phase of the reference signal REF. The adder 45 adds an integer phase and a fractional phase. The subtractor 46 subtracts the output signal of the adder 45 from the output signal of the reference phase accumulator 44 to detect a phase error signal PHE between the reference signal REF and the oscillation signal.

Figure 9:
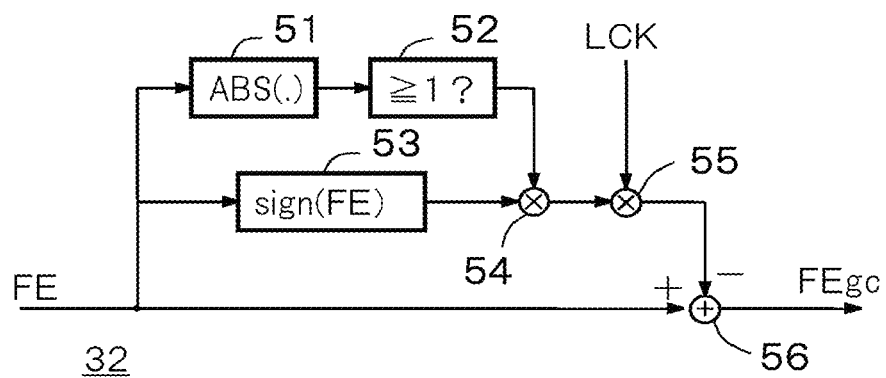
FIG. 9 is a block diagram showing an example of the internal structure of a glitch corrector.

FIG. 9 is a block diagram showing an example of the internal configuration of the glitch corrector 32 of FIG. 7. The glitch corrector 32 of FIG. 9 is the same as that of FIG. 6 in circuit block. The glitch corrector 32 has an absolute-value arithmetic unit (absolute-value arithmetic circuitry) 51, an absolute-value determination unit (absolute-value determination circuitry) 52, a sign determination unit (sign determination circuitry) 53, an arithmetic unit (arithmetic circuitry) 54, a multiplier 55, and a subtractor 56.

The absolute-value arithmetic unit 51 obtains an absolute value of the phase error signal PHE. The absolute-value determination unit 22 determines whether the absolute value of the phase error signal PHE is equal to or larger than a specific threshold value. In the phase-lock state, since a large phase error does not basically occur, if the phase error signal PHE contains a glitch, the absolute value of the phase error signal PHE is equal to or larger than the threshold value. Then, the sign determination unit 53 determines whether the phase error signal PHE is positive or negative. If the phase error signal PHE is positive, the arithmetic unit 54 subtracts a value (1 phase=2π) corresponding to 1 LSB of the counter 2 from the phase error signal PHE. If the phase error signal PHE is negative, the arithmetic unit 24 adds the value (1 phase=2π) corresponding to 1 LSB of the counter 2 to the phase error signal PHE. A glitch-corrected phase error signal PHEgc output from the subtractor 56 is expressed by the following expression (2).

$$PHEgc=PHFE-\text{sign (PHE)} \quad (2)$$

It is supposed that the absolute value of the phase error signal PHE is smaller than a value corresponding to the input range of the TDC 3. In this case, it is deemed that there is no glitch, the output signal of the arithmetic unit 54 thus becomes zero so that the output signal PHEgc of the subtractor 56 has the same value as the phase error signal PHE.

As described above, in the second embodiment, in the phase-lock state, the phase error signal PHE is obtained based on the frequency control signal FCW, and the integer and fractional phases. Then, a glitch contained in the phase error signal PHE is compared with the threshold value to correct the glitch to remove an effect of the glitch after the counter 2 stops integer phase measurements. Therefore, the phase-lock state can be stably maintained.

(Third Embodiment)

Figure 10:
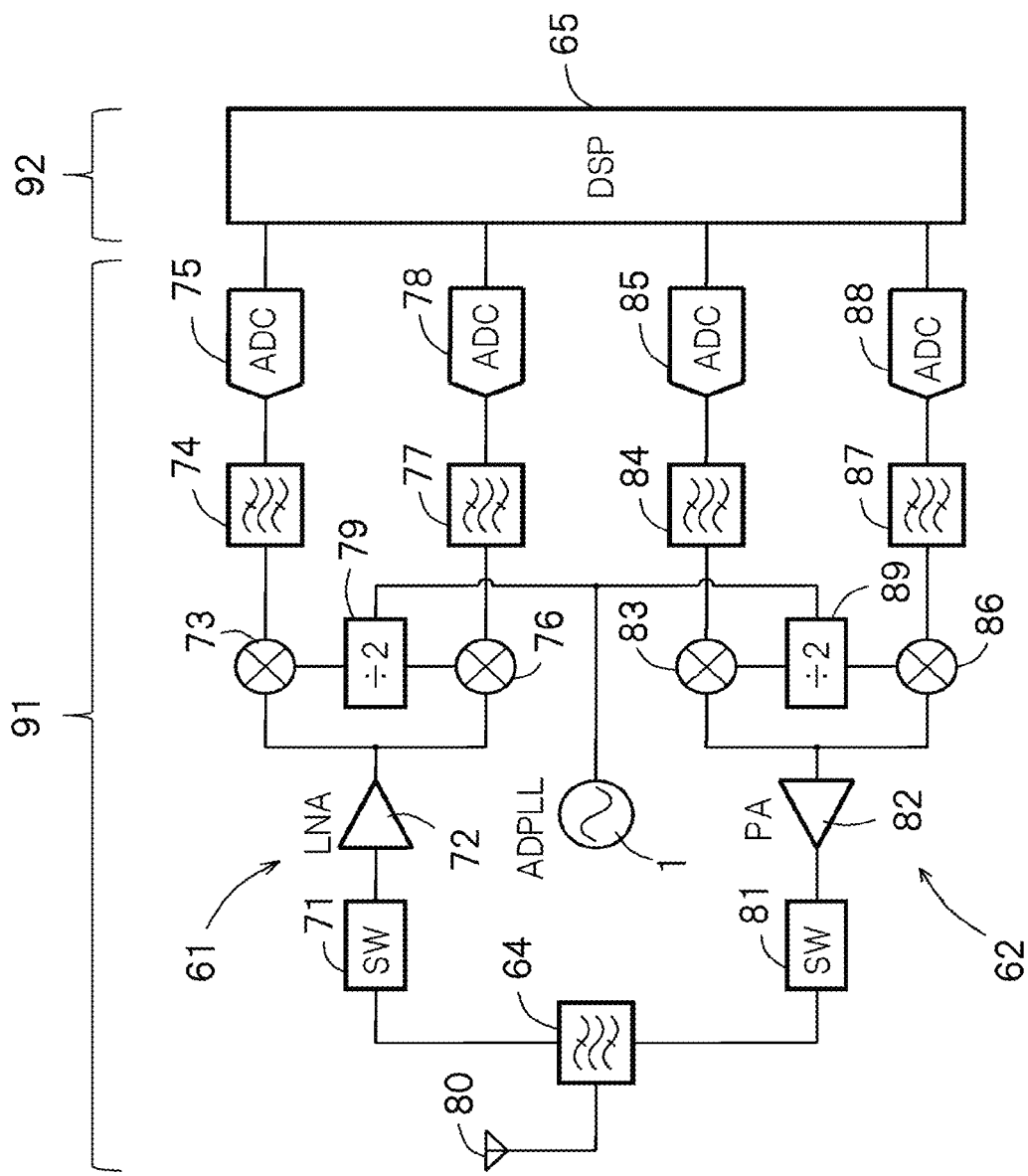
FIG. 10 is a block diagram showing the internal structure of a wireless communication apparatus having a phase locked loop.

The phase synchronization circuitries 1 of the above-described first and second embodiments can be used in a reception circuitry 61 or a wireless communication apparatus 63 provided with the reception circuitry 61 and a transmission circuitry 62. FIG. 10 is a block diagram showing the internal configurations of the reception circuitry 61 having the phase locked loop 1 (ADPLL) of the first or the second embodiment and the wireless communication apparatus 63.

The wireless communication apparatus 63 of FIG. 10 is provided with an RF unit (RF circuitry) 91 and a baseband unit (baseband circuitry) 92. The RF unit 91 has a transmission circuitry 62, a reception circuitry 61, an ADPLL 1 for generating a local oscillation signal which is used by both of the transmission circuitry 62 and the reception circuitry 61, and a band-pass filter (BPF) 64 connected to an antenna 80. The baseband unit 92 has a signal processor (DSP) 65 for baseband processing. The ADPLL 1 of FIG. 10 is the phase locked loop 1 explained in the first or second embodiment. The entire wireless communication apparatus 63 of FIG. 10 can be integrated into one chip IC (Integrated Circuit). Or the wireless communication apparatus 63 of FIG. 10 may be integrated into a plurality of chips. For example, the RF unit 91 and the baseband unit 92 may be integrated into separate chips. The RF unit 91 may be integrated into a plurality of chips. The baseband unit 92 may also be integrated into a plurality of chips.

The reception circuitry 61 has a transmission-reception switch 71, a low noise amplifier (LNA) 72, a mixer (MIX) 73 for I-signal reception, a low-pass filter (LPF) 74 and an A/D converter (ADC) 75, a mixer (MIX) 76 for Q-signal reception, a low-pass filter (LPF) 77 and an A/D converter (ADC) 78, and a frequency divider 79 for dividing a local oscillation signal from the ADPLL 1.

The transmission circuitry 62 has a transmission-reception switch 81, a power amplifier (PA) 82, a mixer (MIX) 83 for I-signal transmission, a low-pass filter (LPF) 84 and a D/A converter (DAC) 85, a mixer (MIX) 86 for Q-signal transmission, a low-pass filter (LPF) 87 and a D/A converter (DAC) 88, and a frequency divider 89 for dividing the local oscillation signal from the ADPLL 1.

The signal processor 65 has a transmitting function, a receiving function, and a function of processing in a MAC (Media Access Control) layer or in a network layer above the MAC layer.

A wireless communication apparatus 63 having separate reception and transmission circuitries 61 and 62 may be provided.

Although the wireless communication apparatus 63 of FIG. 10 has only one antenna 80, there is no particular limitation on the number of antennas. For example, a transmission antenna 80 and a reception antenna 80 may be separately provided. An I-signal antenna 80 and a Q-signal antenna 80 may be separately provided. Moreover, in the case of one antenna 80, it can be switched by a transmission-reception switch between transmission and reception.

The wireless communication apparatus 63 of FIG. 10 is applicable to a standalone wireless communication apparatus 63 such as an access point, a wireless router and a computer, or a portable wireless communication terminal such as a smartphone and a mobile phone. The wireless communication apparatus 63 of FIG. 10 is also applicable to peripheral equipment such as a mouse and a keyboard for wireless communication with a host device, a card device with a wireless communication function, and a wearable terminal for biological-information wireless communication. As for the wireless mode in which the wireless communication apparatuses 63 of FIG. 10 have wireless communication each other, a variety of types are applicable with no particular limitation, such as cellular communication in the third generation and thereafter, a wireless LAN, Bluetooth (a registered trademark), and a near-field wireless communication.

Figure 11:
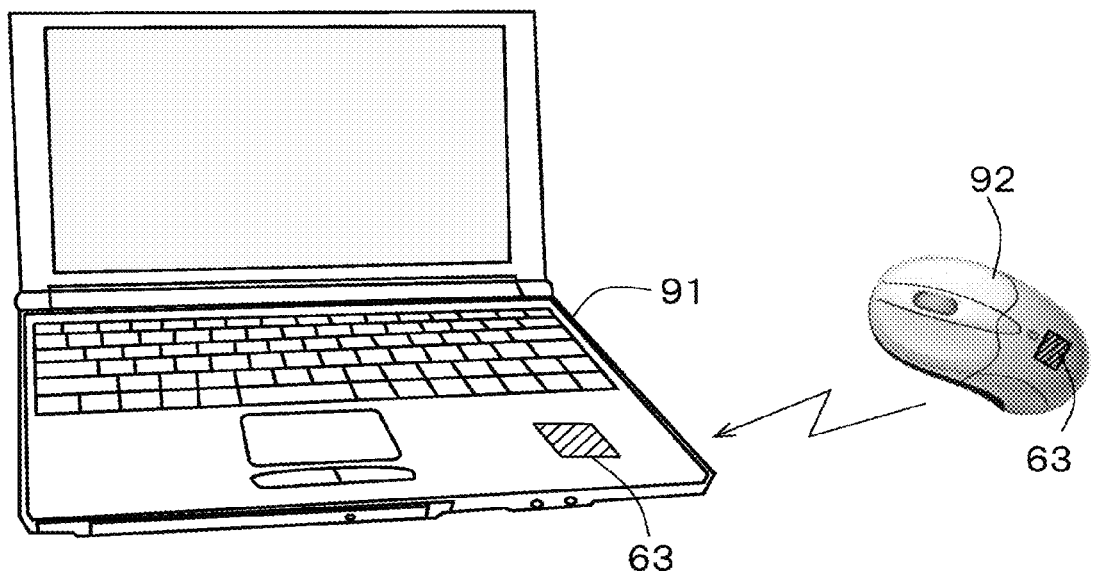
FIG. 11 shows an example of wireless communication between a PC and a mouse.

FIG. 11 shows an example of wireless communication between a PC 91 as a host device and a mouse 92 as peripheral equipment. The PC 91 and the mouse 92 both have the wireless communication apparatus 63 of FIG. 10 built therein. The mouse 92 performs wireless communication with power of a built-in battery. However, due to the limited space for the built-in battery, the mouse 92 is required to perform wireless communication with power consumption as low as possible. It is therefore preferable to perform wireless communication by a low-power consuming wireless mode such as Bluetooth Low Energy defined by Bluetooth (a registered trademark) 4. 0 standard.

Figure 12:
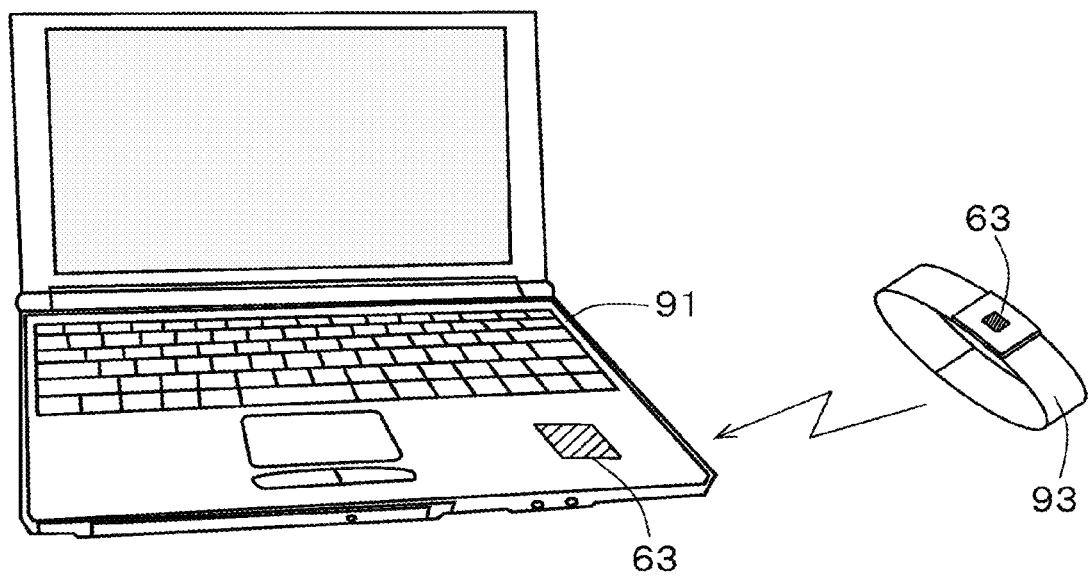
FIG. 12 shows an example of wireless communication between a PC and a wearable terminal.

FIG. 12 shows an example of wireless communication between a wearable terminal 93 and a host device (such as the PC 91). The wearable terminal 93 is attached to a human body, which has a variety of types, not only the one attached to an arm as shown in FIG. 12, but also a seal type adhered to a human body, an eyeglass type and an earphone type attached to a human body other than the arm, and a pace maker embedded in a human body. Also in the case of FIG. 12, the wearable terminal 93 and the PC 91 both have the wireless communication apparatus 63 of FIG. 10 built therein. The PC 91 is a computer, a server, etc. Moreover, also the wearable terminal 93 to be attached to a human body has a limited space for a built-in battery, it is preferable to adopt a low-power consuming wireless mode such as Bluetooth Low Energy described above.

When wireless communication is performed between the wireless communication apparatuses 63 of FIG. 10, there is no particular limitation on the type of information to be transferred by wireless communication. However, it is preferable to switch between the wireless mode for the transfer of a large amount of information such as motion video data and the wireless mode for the transfer of a small amount of information such as operation information of the mouse 92. It is required to perform wireless communication in an appropriate wireless mode depending on the amount of information transferred.

Moreover, when wireless communication is performed between the wireless communication apparatuses 63 of FIG. 10, a notification unit (notification circuitry) for notifying a user of a wireless communication operational state may be provided. Examples of the notification unit are, for example, an indicator such as an LED for indicating an operational state, a vibrator for notifying an operational state with vibration, and a speaker or a buzzer for notifying an operational state with audio information.

At least part of the phase locked loop 1 and the wireless communication apparatus 63 explained in the above-described embodiments may be configured with hardware or software. When it is configured with software, a program that performs at least part of the functions of the phase locked loop 1 and the wireless communication apparatus 63 may be stored in a storage medium such as a flexible disk and CD-ROM, and then installed in a computer to run thereon. The storage medium may not be limited to a detachable one such as a magnetic disk and an optical disk but may be a standalone type such as a hard disk drive and a memory.

Moreover, a program that achieves the function of at least part of the phase locked loop 1 and the wireless communication apparatus 63 may be distributed via a communication network (including wireless communication) such as the Internet. The program may also be distributed via an online network such as the Internet or a wireless network, or stored in a storage medium and distributed under the condition that the program is encrypted, modulated or compressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A phase locked loop comprising:
an integer phase detector to detect an integer phase by measuring a cycle number of at least one of an output signal of an oscillator and an oscillation signal that is a division signal of the output signal of the oscillator;
a fractional phase detector to detect a fractional phase of smaller than one cycle between a reference signal and the oscillation signal;
a frequency error generator to generate a frequency error signal between the reference signal and the oscillation signal based on a frequency control signal which controls a frequency of the reference signal, and the integer and fractional phases;
a glitch corrector to correct the frequency error signal to generate and output a glitch-corrected signal when an absolute value of the frequency error signal is equal to or larger than a specific threshold value and to output the frequency error signal when the absolute value of the frequency error signal is smaller than the specific threshold value;
a phase error generator to generate a phase error by integrating an output signal of the glitch corrector by temporal integration;
an oscillator controller to control an oscillation frequency of the oscillation signal based on the phase error signal; and
a synchronous detector to detect whether a phase of the reference signal and a phase of the oscillation signal are in a phase-lock state based on the output signal of the glitch corrector, and to stop detection of the integer phase when the phase-lock state is detected.

2. The phase locked loop of claim 1 wherein the frequency error generator generates the frequency error signal when the synchronous detector does not detect the phase-lock state.

3. The phase locked loop of claim 1 wherein the glitch corrector generates and outputs the glitch-corrected signal when the fractional phase becomes discontinuous while the integer phase detector is stopping a measuring operation.

4. The phase locked loop of claim 3 wherein the glitch corrector generates the glitch-corrected signal by subtracting a value corresponding to one phase detected by the integer phase detector from the frequency error signal when the absolute value of the frequency error signal is equal to or larger than the specific threshold value and the frequency error signal is positive, and generates the glitch-corrected signal by adding the value corresponding to one phase to the frequency error signal when the absolute value of the frequency error signal is equal to or larger than the specific threshold value and the frequency error signal is negative.

5. A phase locked loop comprising:
an integer phase detector to detect an integer phase by measuring a cycle number of at least one of an output signal of an oscillator and an oscillation signal that is a division signal of the output signal of the oscillator;
a fractional phase detector to detect a fractional phase of smaller than one cycle between a reference signal and the oscillation signal;
a phase error generator to generate a phase error signal between the reference signal and the oscillation signal based on a frequency control signal which controls a frequency of the reference signal, and the integer and fractional phases;
a glitch corrector to correct the frequency error signal to generate and output a glitch-corrected signal when an absolute value of the phase error signal is equal to or larger than a specific threshold value and to output the phase error signal when the absolute value of the phase error signal is smaller than the specific threshold value;
an oscillation controller to control an oscillation frequency of the oscillation signal based on an output signal of the glitch corrector; and
a synchronous detector to detect whether a phase of the reference signal and a phase of the oscillation signal are in a phase-lock state based on the output signal of the glitch corrector, and to stop detection of the integer phase when the phase-lock state is detected.

6. The phase locked loop of claim 5 wherein the phase error generator generates the phase error signal when the synchronous detector does not detect the phase-lock state.

7. The phase locked loop of claim 5 wherein the glitch corrector generates and outputs the glitch-corrected signal when the fractional phase becomes discontinuous while the integer phase detector is stopping a measuring operation.

8. The phase locked loop of claim 7 wherein the glitch corrector generates the glitch-corrected signal by subtracting a value corresponding to one phase detected by the integer phase detector from the phase error signal when the absolute value of the phase error signal is equal to or larger than the specific threshold value and the phase error signal is positive, and generates the glitch-corrected signal by adding the value corresponding to one phase to the phase error signal when the absolute value of the phase error signal is equal to or larger than the specific threshold value and the phase error signal is negative.

9. The phase locked loop of claim 1 wherein the oscillator controller comprises a loop filter.

10. The phase locked loop of claim 1 further comprising an integrated circuit that comprises the integer phase detector, the fractional phase detector, the frequency error generator, the glitch corrector, the phase error generator, and the synchronous detector.

11. The phase locked loop of claim 1 further comprising at least one antenna.

12. A wireless communication apparatus comprising an RF circuitry and a baseband circuitry, wherein
the RF circuitry comprises a transmission circuitry and a reception circuitry; and
the baseband circuitry comprises a transmission process circuitry and a reception process circuitry, wherein
the reception circuitry comprises:

an integer phase detector to detect an integer phase by measuring a cycle number of at least one of an output signal of an oscillator and an oscillation signal that is a division signal of the output signal of the oscillator;

a fractional phase detector to detect a fractional phase of smaller than one cycle between a reference signal and the oscillation signal;

an error generator to generate an error signal that indicates a frequency or phase error between the reference signal and the oscillation signal based on a frequency control signal which controls a frequency of the reference signal, and the integer and fractional phases;

a glitch corrector to correct the error signal to generate and output a glitch-corrected signal when an absolute value of the error signal is equal to or larger than a specific threshold value and to output the error signal when the absolute value of the error signal is smaller than the specific threshold value;

an oscillator controller to control an oscillation frequency of the oscillation signal based on the error signal; and a synchronous detector to detect whether a phase of the reference signal and a phase of the oscillation signal are in a phase-lock state based on the output signal of the glitch corrector, and to stop detection of the integer phase when the phase-lock state is detected.

13. A communication method comprising:

detecting an integer phase by measuring a cycle number of at least one of an output signal of an oscillator and an oscillation signal that is a division signal of the output signal of the oscillator;

detecting a fractional phase of smaller than one cycle between a reference signal and the oscillation signal;

generating an error signal that indicates a frequency or phase error between the reference signal and the oscillation signal based on a frequency control signal which controls a frequency of the reference signal, and the integer and fractional phases;

generating and outputting a glitch-corrected signal by correcting the error signal when an absolute value of the error signal is equal to or larger than a specific threshold value and outputting the error signal when the absolute value of the error signal is smaller than the specific threshold value;

controlling an oscillation frequency of the oscillation signal based on the error signal; and detecting whether a phase of the reference signal and a phase of the oscillation signal are in a phase-lock state based on the error signal, and stopping detection of the integer phase when the phase-lock state is detected.

* * * * *